United States Patent [19]

Tanaka et al.

[11] 4,025,879
[45] May 24, 1977

[54] ELECTROMECHANICAL REED FILTER

[75] Inventors: Toshiharu Tanaka; Naoteru Tsuda; Kazuhide Arase, all of Kadoma, Japan

[73] Assignee: Matsushita Electric Industrial Co., Ltd., Japan

[22] Filed: Dec. 16, 1975

[21] Appl. No.: 641,271

[30] Foreign Application Priority Data

Dec. 26, 1974 Japan .......................... 50-3211[U]
Jan. 25, 1975 Japan ........................ 50-11506[U]
Feb. 18, 1975 Japan ...................... 50-227724[U]

[52] U.S. Cl. .................................. 333/71; 310/8.2; 310/9.4; 333/72
[51] Int. Cl.² .................. H03H 9/04; H04R 11/14; H04R 17/10; H01L 41/10
[58] Field of Search ................. 333/71, 72; 310/25, 310/8.2, 9.4, 25, 26; 331/154–157

[56] References Cited

UNITED STATES PATENTS 3,525,884   8/1970   Onoe et al. ...................... 333/71 X
3,795,831   3/1974   Fujita ............................... 310/25

*Primary Examiner*—Alfred E. Smith
*Assistant Examiner*—Marvin Nussbaum
*Attorney, Agent, or Firm*—Robert E. Burns; Emmanuel J. Lobato; Bruce L. Adams

[57] ABSTRACT

Shock-absorbing members are provided in the vicinity of free ends of vibratory reeds of an electromechanical reed filter and deformable in at least two stages so as to stepwisely absorb external shocks being imparted to the filter for ensuring stability of the operation of the filter.

9 Claims, 12 Drawing Figures

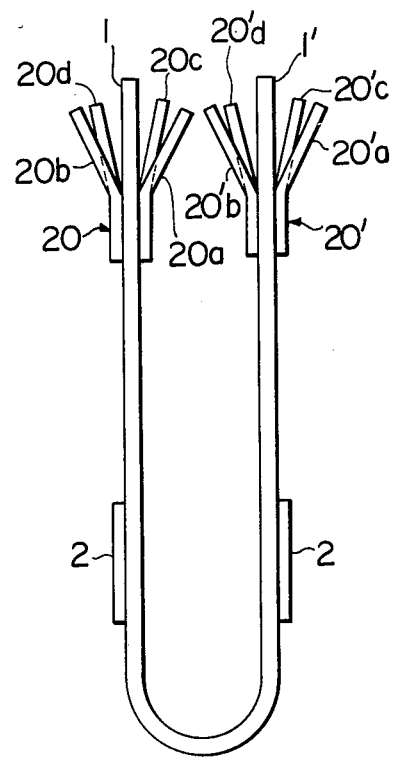
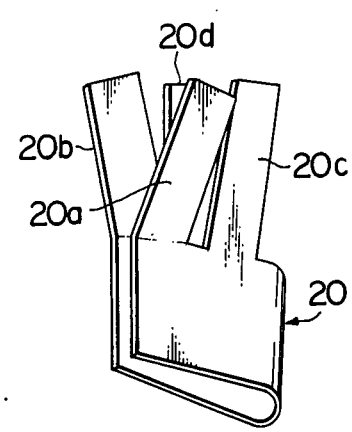
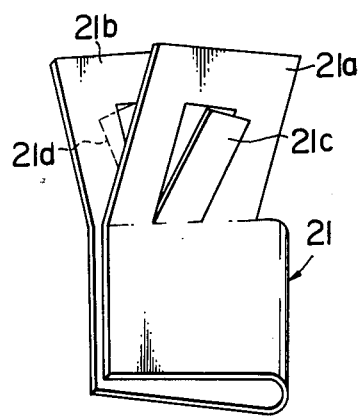

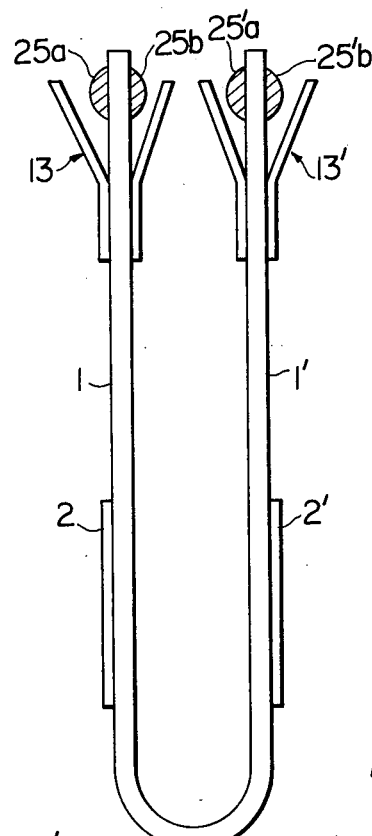
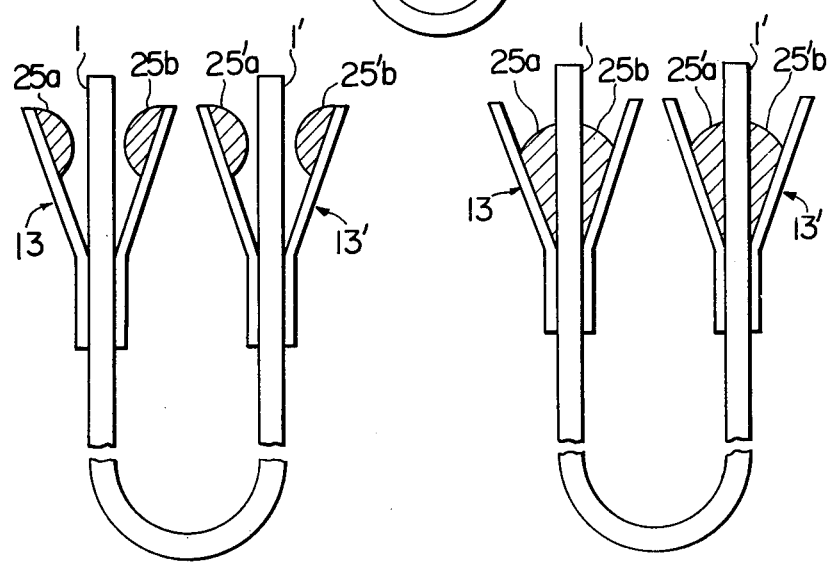

ELECTROMECHANICAL REED FILTER

BACKGROUND OF THE INVENTION

The present invention relates generally to an electromechanical reed filter, particularly to an electromechanical reed filter of a miniature type employing vibratory reeds as frequency filtering elements, and more paticularly to means for ensuring stability of the operation of the filter against external shocks being imparted to the filter.

It is well known that a tuning fork which consists of a pair of vibratory reeds (usually made of metal) extending from the end of a stem, when struck, emits a tone of fixed pitch. Owing to their simple mechanical structure, purity of tone, and resonant frequency, tuning forks are widely used as standards of frequency in the acoustics. Furthermore, because of the constant frequency which is primarily determined by the length and the thickness of the reed elements, tuning forks are also used in electronics as a filtering element in an arangement known as an electromechanical reed filter. In such an arrangement, the tuning fork is provided with a pair of electromechanical transducers such as piezoelectric elements, one for causing vibrations by an exciting input signal and the other for converting the vibration at the natural frequency of the tuning fork into an electric signal. The tuning fork, when excited by the input signal, is caused to vibrate at its natural or fundamental frequency, and thus only the signal having a frequency which is equal to the fundamental frequency is obtained at the output. In the filter arrangement, the piezoelectric elements are usually adhered or bonded by an adhesive to the side surface of the respective reed elements and coupled to input and output circuits.

The size of the reed elements is however intimately associated with the frequency desired, and thus relatively large as compared with other electronic device components. Therefore, the tendency is toward reducing the size of the casing in which the reed elements are housed, so that very slight clearance will be allowed between the inner walls of the casing and the reed elements of the tuning fork. Under such circumstances, violent transverse vibrations would occur at the free ends of the reeds upon the filter casing being subjected to abnormal external shocks which cause a flexure of reed elements to a considerable degree and the free ends of the reeds would collide violently with each other and/or with the inner walls of the casing. For this reason, deformation and/or cracks are likely to occur especially in the adhesive securing the piezoelectric element to the reed element and the contact therebetween in severely impaired. Due to these undesirable occurrences, the accuracy of resonance of the filter is forever lost. In addition, the incipient cracks spread rapidly and cause permanent damage to the filter.

Therefore, shock-absorbing means have been proposed to effectively remove the aforementioned defects inherent in the conventional electromechanical reed filter of a miniature type. However, they have been proven to be unsatisfactory for effectively absorbing external shocks as will be discussed in detail in connection with FIGS. 1a and 1b.

SUMMARY OF THE INVENTION

In accordance with the present invention, an electromechanical reed filter comprising: a base member; a protective casing mounted on said base member and defining therewith a housing; a plurality of resonant reeds disposed within the housing, one ends of the reeds being connected together and connected to the base member thereby mounting the reeds with their other ends free to undergo mechanical resonance; a plurality of electromechanical transducers each adhered by adhesive to respective ones of said reeds; and shock-absorbing means being disposed in the vicinity of the other end of each of said reeds and deformable in at least two stages so as to stepwisely absorb external shocks being imparted to the filter for preventing collision between said reeds and/or collision of said reed with protective casing.

Therefore, an object of the present invention is to provide improved shock-absorbing means which is deformable in at least two stages so as to stepwisely absorb external shocks being imparted to an electromechanical reed filter for ensuring stability of the operation of the filter.

Another object of the present invention is to provide improved means for facilitating fine adjustment of resonant frequency of an electromechanical reed filter.

BRIEF DESCRIPTION OF THE DRAWINGS

These and other objects, features and many of the attendant advantages of this invention will be appreciated more readily as the invention becomes better understood by the following detailed description, wherein like parts in each of the several figures are identified by the same reference characters, and wherein:

FIGS. 4a and 4b are diagrammatic views illustrating a second preferred embodiment of the present invention;

FIG. 5 is a diagrammatic view of a modification of the second preferred embodiment;

FIG. 6 is a diagrammatic view illustrating a third preferred embodiment of the present invention; and FIGS. 7 and 8 are diagrammatic views illustrating modifications of the third preferred embodiment.

DESCRIPTION OF THE PREFERRED EMBODIMENTS

Figure 1A:
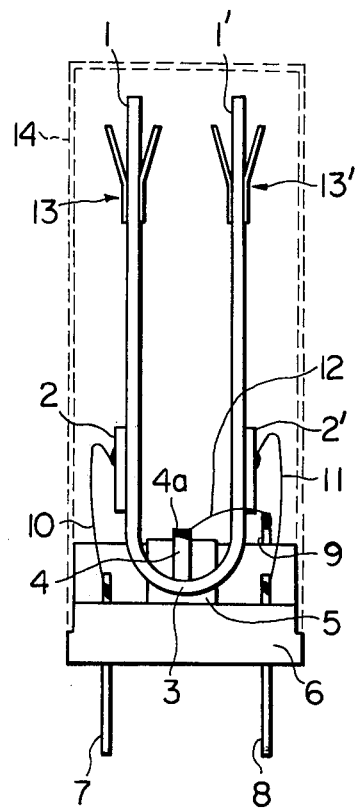
FIGS. 1a and 1b are diagrammatic plan views of a conventional type of electromechanical reed filter.
Figure 1B:
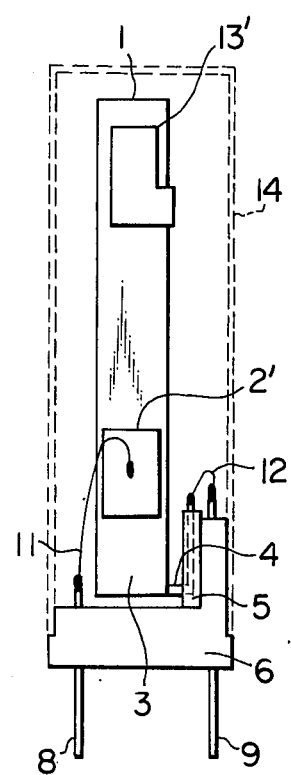

Referring now to FIGS. 1a and 1b, there is shown a conventional electromechanical filter with which the present invention is concerned and which comprises a tuning fork having a pair of elongated mechanically resonant metal reeds 1 and 1' which extend in parallel from a stem portion 3 securely fixed or integrated with a metal support 4. The metal support 4 is in turn securely fixed to and extends through a resilient base member 5 of an insulating material to serve as a terminal for providing connection to the ground. That is, one end 4a of the metal support 4 is connected through a conducting lead 12 to a top portion of a terminal pin 9. As best shown in FIG. 1b, the terminal pin 9 extends through a bottom member 6 of an insulating material 6. The reed 1 and 1' are held, within a protecting casing 14 as shown in broken lines, at a distance from the upper surface of the bottom member 6 with the free ends thereof arranged to vibrate transversely when an exciting signal is applied thereto. Piezoelectric transducers 2 and 2' are cemented or bonded to the sides of the reeds 1 and 1' in the vicinity of vibrating nodes of the respective reeds 1 and 1' by means of a suitable adhesive which assures complete surface-to-surface cementation therebetween, so that the reeds are effectively caused to vibrate by the exciting signal and the vibration thereof at the natural frequency of the reeds are effectively converted into an output electric signal. Electrical connections are made, through conducting leads 10 and 11, to the transducers 2 and 2' and to respective terminal pins 7 and 8 which extend through the bottom member 6 and are securely fixed thereto. The terminal pin 7 serves as an input terminal and the terminal pin 8 as an output terminal.

As shown in FIGS. 1a and 1b, shock-absorbing members 13 and 13' are provided respectively in the vicinities of the free ends of the reeds 1 and 1' for preventing cracking of the adhesive by preventing collision between the reeds 1 and 1' and/or collision of the reeds with the inner walls of the protective casing 14. The adhesive, as previously mentioned, is employed for fixedly attaching the piezoelectronic transducers 2 and 2' to the respective reeds 1 and 1'.

In the above-mentioned prior art, however, the shock-absorbing members 13 and 13' can not effectively absorb intense external shocks nor comparatively weak external ones. This is because, when material of high resiliency is used as the shock-absorbing members 13 and 13', the comparatively weak external shocks can not be effectively absorbed, and when material of low resiliency is used as the shock-absorbing members 13 and 13', the intense external shocks can not be effectively absorbed.

Furthermore, in accordance with the prior art, the space between the free ends of the shock-absorbing members 13 and 13', is liable to become narrower as intense external shocks are frequently imparted, resulting in that the effective shock absorbing, especially against the intense external shocks, is no longer attained due to the space having been narrowed.

Therefore, when abnormally large external shocks are imparted to the filter of a conventional type, the aforementioned collision often times causes cracks and/or deformation in the adhesive, and once cracks and/or deformation develope, the accuracy of resonance of the filter is forever lost. In addition, the incipient cracks spread rapidly and cause permanant damage to the filter.

The present invention consists of removal of the inherent disadvantages of the prior art. The electromechanical reed filter according to the present invention, in brief, is provided with improved shock-absorbing means which are disposed respectively in the vicinities of the free ends of the reeds and are deformable in at least two stages so as to stepwisely absorb external shocks being imparted to the filter for preventing cracking of the adhesive by preventing collision between the reeds and/or collision of the reeds with the protecting casing. Thus, the shock-absorbing means can effectively absorb intense external shocks as well as weak external ones, thereby to prevent cracking of the adhesive for preventing spurious vibrations of the reeds.

Figure 2A:
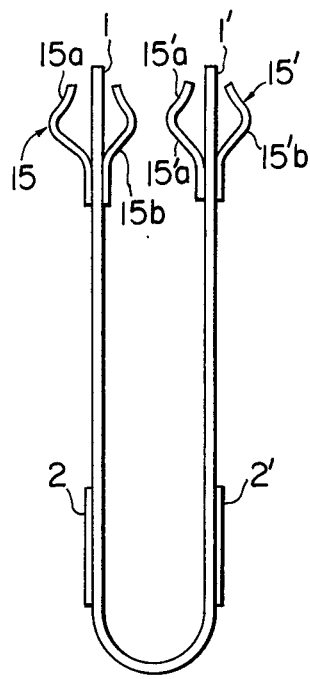
FIGS. 2a and 2b are diagrammatic views of a first preferred embodiment of the present invention.
Figure 2B:
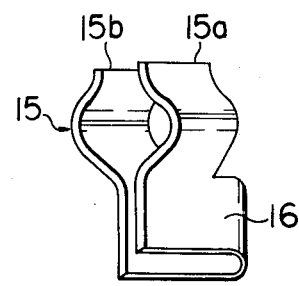

Reference is now made to FIGS. 2a and 2b, in which a first preferred embodiment of the present invention is schematically illustrated. Improved shock-absorbing members 15 and 15' of substantially a same shape are provided in the vicinities of the free ends of the reeds 1 and 1' as shown in FIG. 2a. In FIG. 2b, a detail configuration of the shock-absorbing member 15 is shown in a perspective view, wherein a pair of resilient strips 15a and 15b is connected together at each end thereof to form a substantially U-shaped portion 16. The portion 16 is fixedly attached, by a suitable adhesive or by welding, to the reed 1 in the vicinity of the free end thereof as shown in FIG. 2a. Each of the resilient strips 15a and 15b has a boxed shape, being outwardly bent from the reed 1 in the neighborhood of the portion 16 and then inwardly bent toward the reed 1 such that the distance between the free ends of the resilient strips 15a and 15b are spaced by a distance greater than the thickness of the reed 1.

Figure 3A:
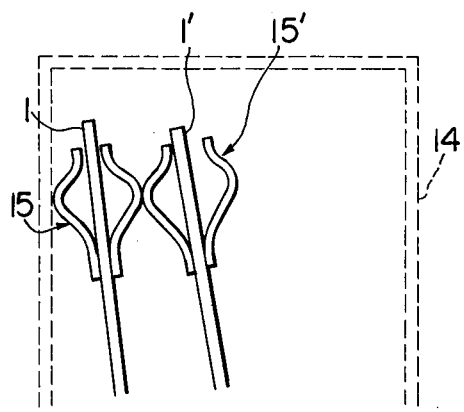
FIGS. 3a and 3b are diagrammatic fragmentary views illustrating operation modes of the first preferred embodiment.
Figure 3B:
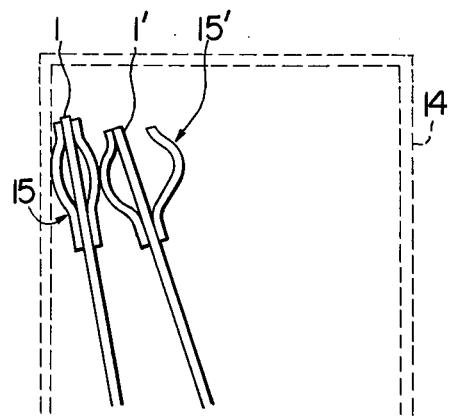

Reference is now made to FIGS. 3a and 3b, in which there are illustrated how the shock-absorbing members 15 and 15' of the first preferred embodiment can effectively absorb intense external shocks as well as weak external ones. In FIG. 3a, there is illustrated an absorbing manner of the members 15 and 15' in the case where weak external shocks are imparted, on the other hand, in FIG. 3b, there is illustrated another absorbing manner of the members 15 and 15' in the case where intense external shocks are imparted. As shown in FIG. 3a, the shock-absorbing members 15 and 15' resiliently collide or contact with each other and/or with the inner wall of the protecting casing 14. In this case, the members 15 and 15' are designed to effectively absorb the weak external shocks without their free ends contacting with the reeds 1 and 1', respectively. On the contrary, in the case where intense external shocks are imparted to the filter (FIG. 3b), the members 15 and 15' are forcibly pressed toward the respective reeds 1 and 1', so that some or all of the free ends of the members 15 and 15' come into contact with the reeds 1 and 1' and then slide on the major surfaces thereof towards the free ends of the reeds 1 and 1'. Thus, the intense external shocks are effectively absorbed due to comparatively strong repelling force of the members 15 and 15'.

Reference is now made to FIGS. 4a and 4b, wherein a second preferred embodiment of the present invention is schematically illustrated. As shown in FIG. 4a, shock-absorbing members 20 and 20' in accordance with the present invention are fixedly attached to the respective reeds 1 and 1' in the vicinity of the free ends thereof. In FIG. 4b, the shock-absorbing member 20 is shown in a perspective for illustrating the detail configuration thereof. Four resilient strips 20a, 20b, 20c and 20d are connected together at one end thereof to form a substantially U-shaped portion which is to be fixedly attached to the reed 1 by a suitable adhesive or welding. As shown, two strips 20a and 20b are oppositely and outwardly bent at a greater than the other two strips 20c and 20d.

In operation, in the case where weak external shocks are imparted to the filter, the strips 20a, 20b, 20'a and 20'b resiliently contact with each other and/or with the inner wall of the casing 14. On the other hand, in the case where intense external shocks are imparted to the filter, in addition to the above case, the other strips 20c, 20d, 20'c and 20'd come into resilient contacts with each other and/or with the inner wall of the casing 14. Thus, the shock-absorbing members 20 and 20' stepwisely absorb the intense external shocks. Therefore, in accordance with the present preferred embodiment, mechanical fatigue in each of the resilient strips, which is caused when the strips are subjected to repeated loads, is comparatively eliminated as compared with that in each of the conventional strips of FIG. 1a or FIG. 1b.

In FIG. 5, a modification of the shock-absorbing member 20 or 20' of FIG. 4a is illustrated in a perspective. As shown, each of resilient strips 21a and 21b is slotted in a substantial U-shape, and then the slotted strips 21c and 21d are outwardly bent. The function of the member 21 is similar to that of the member 20 or 20', so that further description thereof will be omitted for clarity.

In the above, it is understood that additional resilient strips, each of which is outwardly bent at an angle different from that of the members 20a and 20c, are also provided if desired.

Referring to FIG. 6, there is shown a third preferred embodiment of the present invention. The present embodiment comprises the members 13 and 13', and four elements 25a, 25b, 25'a and 25'b of resilient material such as rubber or high molecular resilient substance. The elements 25a and 25b are attached to the respective surfaces of the reed 1 in such a manner as to be between the reed 1 and the resilient strips (no numerals) of the member 13. Similarly, a pair of another elements 25'a and 25'b is provided in the same manner as in the above.

In operation, in the case where weak external shocks are imparted to the filter, the strips of the members 13 and 13' resiliently contact with each other and/or with the inner wall of the casing 14. Whilst, in the case where intense external shocks are imparted to the filter, the strips are pressed inwardly to resiliently contact with some or all of the elements 25a, 25b, 25'a and 25'b. Thus, the shock-absorbing means of the present embodiment stepwisely absorb the external shocks, so that mechanical fatigue in each of the resilient strips of the members 13 and 13' is comparatively eliminated as compared with the absence of the elements 25a, 25b, 25'a, and 25'b.

Furthermore, the present embodiment has the following advantage: fine adjustment of the resonant frequency of the filter can be readily performed by adjusting the amount of the resilient material of the elements 25a, 25b, etc. This feature is remarkable when considering the fact that the fine adjustment has been hitherto carried out by cutting the reeds 1 and 1'. In other words, according to the prior art, mechanical deformations in the reeds are liable to occur during the cutting operation, thereby causing undesirable characteristic changes of the filter with the passage of time. On the other hand, in accordance with the present embodiment, the above-mentioned defect inherent in the prior art is readily removed and furthermore the manufacturing time of the filter can be shortened due to the easy fine adjustment.

In FIG. 7, there is shown a modification of the FIG. 6 embodiment of the present invention. In FIG. 7, unlike the FIG. 6 embodiment, the resilient members 25a, 25b, 25'a and 25'b are fixedly attached on the surfaces of the resilient strips (no numeral) of the member 13 and 13' in such a manner as to be between the resilient strips and the reeds 1 and 1'. The operation of the FIG. 7 embodiment is similar to that of the FIG. 6 embodiment, so that further illustration will be omitted for simplicity. On the other hand, in FIG. 8, the resilient members 25a, 25b, 25'a and 25'b are in turn fixedly attached to both the resilient strips of the members 13 and 13' and the reeds 1 and 1'. The FIG. 8 embodiment does not stepwisely absorb external shocks being imparted to the filter, but it is clear that the aforementioned fine adjustment of the resonant frequency can be carried out.

It is apparent that various modifications may be made in the illustrated embodiments of the present invention within the intended scope of the invention as set forth in the hereinafter appended claims.

What is claimed is:

1. An electromechanical reed filter comprising:
    a base member;
    a protective casing mounted on said base member and defining therewith a housing;
    a plurality of resonant reeds disposed within said housing, one end of each of said reeds being connected together and connected to said base member thereby mounting said reeds with their other ends free to undergo mechanical vibration and resonance;
    a plurality of electromechanical transducers each adhered to respective ones of said reeds; and
    shock-absorbing means disposed on each of said reeds in the vicinity of a free end of each of said reeds and deformable in at least two stages to stepwisely absorb external shocks being imparted to the filter for preventing cracking of said adhesive by preventing direct collision between said reeds and direct collision of said reeds with said protective casing.

2. An electromechanical reed filter claimed in claim 1, wherein each of said shock-absorbing means comprises,
    a pair of laterally spaced resilient, flexible, strips, means connecting one end of each of said resilient strips together to form a portion attached in use to the vicinity of the free end of a respective one of said reeds, each of said resilient strips having a free end remote from said portion and bowed shape being bent outwardly from said reed and then inwardly toward said reed such that the distance between the free ends of the resilient strips is a distance greater than the thickness of the corresponding reed.

3. An electromechanical reed filter claimed in claim 1, wherein each of said shock-absorbing means comprises,
    four resilient, flexible, strips each with one end connected together to define a portion attached in use to in the vicinity of a free end of a corresponding one of said reeds, two of said four resilient strips being oppositely bent outwardly at a greater angle than the other two strips.

4. An electromechanical reed filter claimed in claim 1, wherein said shock-absorbing means comprises:
    two resilient, flexible strips with one end of each of said resilient strips being connected together to form a portion attached in use in the vicinity of a free end of each of said reeds, said two resilient strips being oppositely and outwardly bent; and
    for each reed two resilient shock-absorbing members each of which is disposed between a corresponding one of said two resilient strips and a corresponding reed and disposed on opposite sides of the corresponding reed, and each spaced from the corresponding one of said two resilient strips.

5. An electromechanical reed filter claimed in claim 4, including means attaching each of said two resilient members fixedly to said corresponding one of said two resilient strips.

6. An electromechanical reed filter claimed in claim 4, including means attaching each of said two resilient members fixedly to a corresponding side of a free end of a corresponding one of said reeds.

7. In an electromechanical reed filter comprising, a base member, a protective casing mounted on said base member and defining therewith a housing, a plurality of resonant reeds disposed within said housing, one end of each of said reeds being connected together and connected to said base member thereby mounting said reeds with their other ends free to undergo mechanical resonance, a plurality of electromechanical transducers each adhered to a respective one of said reeds, the improvement which comprises shock-absorbing means disposed in the vicinity of said other end of each of said reeds and deformable in at least two stages to stepwisely absorb external shocks being imparted to the filter for preventing cracking of said adhesive by preventing collision between said reeds and collision of said reeds with said protective casing.

8. An electromechanical reed filter comprising, a plurality of resonant reeds mounted within each housing, means mounting within said housing said reeds each with one end free for allowing mechanical vibration and resonating, shock-absorbing means for each reed for preventing direct collision between next adjacent reeds and direct collision of said reeds with said housing comprising deformable means each mounted on a corresponding reed in the vicinity of the free end of the corresponding reed on opposite sides thereof, each deformable means comprising flexure means for deforming independently and for deforming in two stages of deformation when contact is made therewith.

9. An electromechanical reed filter according to claim 8, in which said deformable means comprises elastically deformable means coactive with said flexure means when said flexure means has deformed a given extent to define a stage of deformation.

* * * * *